United States Patent [19]
Yamaguchi

[11] Patent Number: 5,546,028
[45] Date of Patent: Aug. 13, 1996

[54] CHOPPER TYPE COMPARATOR FOR AN ANALOG-TO-DIGITAL CONVERTER

[75] Inventor: Motoi Yamaguchi, Tokyo, Japan

[73] Assignee: NEC Corporation, Tokyo, Japan

[21] Appl. No.: 524,805

[22] Filed: Sep. 7, 1995

[30] Foreign Application Priority Data

Sep. 7, 1994 [JP] Japan ................................. 6-213776

[51] Int. Cl.⁶ ............................................. H03K 19/0175
[52] U.S. Cl. ................................. 327/64; 327/90; 327/91
[58] Field of Search ................................. 327/64, 90, 91, 327/94, 97, 124, 215, 219, 63, 65, 67, 69, 71

[56] References Cited

U.S. PATENT DOCUMENTS

| | | | |
|---|---|---|---|
| 4,539,551 | 9/1985 | Fujita et al. | 327/89 |
| 4,816,701 | 3/1989 | Ando et al. | 327/77 |
| 4,973,975 | 11/1990 | Yamazaki et al. | 327/91 |
| 5,036,223 | 7/1991 | Sakai et al. | 326/121 |
| 5,075,688 | 12/1991 | Hosotani et al. | 327/94 |
| 5,153,454 | 10/1992 | Kohdaka | 327/69 |
| 5,262,686 | 11/1993 | Kurosawa | 327/77 |
| 5,281,860 | 1/1994 | Krenik et al. | 327/91 |
| 5,381,053 | 1/1995 | Yasuda | 327/91 |
| 5,416,432 | 5/1995 | Lewis et al. | 327/94 |
| 5,465,093 | 11/1995 | Kusumoto et al. | 327/94 |

FOREIGN PATENT DOCUMENTS

63-80617  4/1988  Japan .

OTHER PUBLICATIONS

A. Yukawa, "A CMOS 8–Bit High–Speed A/D Converter IC", IEEE Journal of Solid–State Circuits, vol. SC–20, No. 3, Jun. 1985, pp. 775–779.

A. Dingwall, "THAM 11.1: Monolithic Expandable 6b 15MHz CMOS/SOS A/D Converter", 1979 IEEE International Solid–State Circuits Conference, Feb. 15, 1979, pp. 126–127.

Primary Examiner—Timothy P. Callahan
Assistant Examiner—My-Trang Nu Ton
Attorney, Agent, or Firm—Foley & Lardner

[57] ABSTRACT

A chopper type comparator is disclosed and implements a differential configuration with inverter amplifiers each having a control terminal. The comparator, therefore, successfully cancels noise of the same phase while preventing a current from constantly flowing therethrough. The cancellation of noise of the same phase, coupled with differential signals, doubles the signal range in the same voltage range, compared to a single end configuration. Hence, a high resolution is achievable even when a power source voltage is low.

7 Claims, 10 Drawing Sheets

CHOPPER TYPE COMPARATOR FOR AN ANALOG-TO-DIGITAL CONVERTER

BACKGROUND OF THE INVENTION

The present invention relates to a comparator and, more particularly, to a chopper type comparator for use in an analog-to-digital converter or the like.

A chopper type comparator for the above application is disclosed in, for example, Japanese Patent Laid-Open Publication No. 63-80617. A chopper type comparator has a simple construction consumes a minimum of power because there is no current that constantly flows therethrough. However, the problem with this type of comparator is that it is susceptible to noise due to a single end configuration thereof. On the other hand, a differential chopper time comparator using a full differential amplifier is proposed in "IEEE Journal of Solid-State Circuits", Vol. SC-20, No. 3, June 1985, pp. 775–779. With the differential chopper type comparator, it is possible to cancel noise of the same phase. However, because current constantly flow through the full differential amplifier, the comparator consumes much power. Moreover, should the power source voltage be lowered in order to lower power consumption, the gain of the differential amplifier and, therefore, resolution would be deteriorated. A similar comparator is taught in "1979 IEEE International Solid-State Circuits Conference", Feb. 15, 1979, pp. 126–127.

SUMMARY OF THE INVENTION

It is, therefore, an object of the present invention to provide a chopper type comparator achieving a high resolution even when a power source voltage is low.

A comparator of the present invention has a first input terminal to which a positive signal potential is applied, and a second input terminal to which a positive reference potential is applied. A first selecting switch selects one of the first and second input terminals at a time. A a first capacitor is connected at one end to a stationary terminal of the first selecting switch. A first inverter amplifier has a control terminal and is connected at an input terminal thereof to the other end of the first capacitor. A first switch is connected to the input and output of the first inverter amplifier. A second capacitor is connected at one end thereof to the output of the first inverter amplifier. A third input terminal receives a negative signal voltage while a fourth input terminal receives a negative reference potentia. A second selecting switch selects one of the third and fourth input terminals at a time. A third capacitor is connected at one end thereof to a stationary terminal of the second selecting switch. A second inverter amplifier has a control terminal and is connected at an input thereof to the other end of the third capacitor. A second switch is connected to the input and output of the second inverter amplifier. A fourth capacitor is connected at one end thereof to the output of the second inverter amplifier. A latch circuit is connected at one input thereof to the other end of the second capacitor and at the input terminal thereof to the other end of the fourth capacitor. A third switch is connected between a bias terminal and the control terminal of the second inverter amplifier. A fourth switch is connected between the bias terminal and the control terminal of the first inverter amplifier. A first output is terminal connected to one output terminal of the latch circuit. A second output terminal is connected to the other output terminal of the latch circuit.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Figure 8:
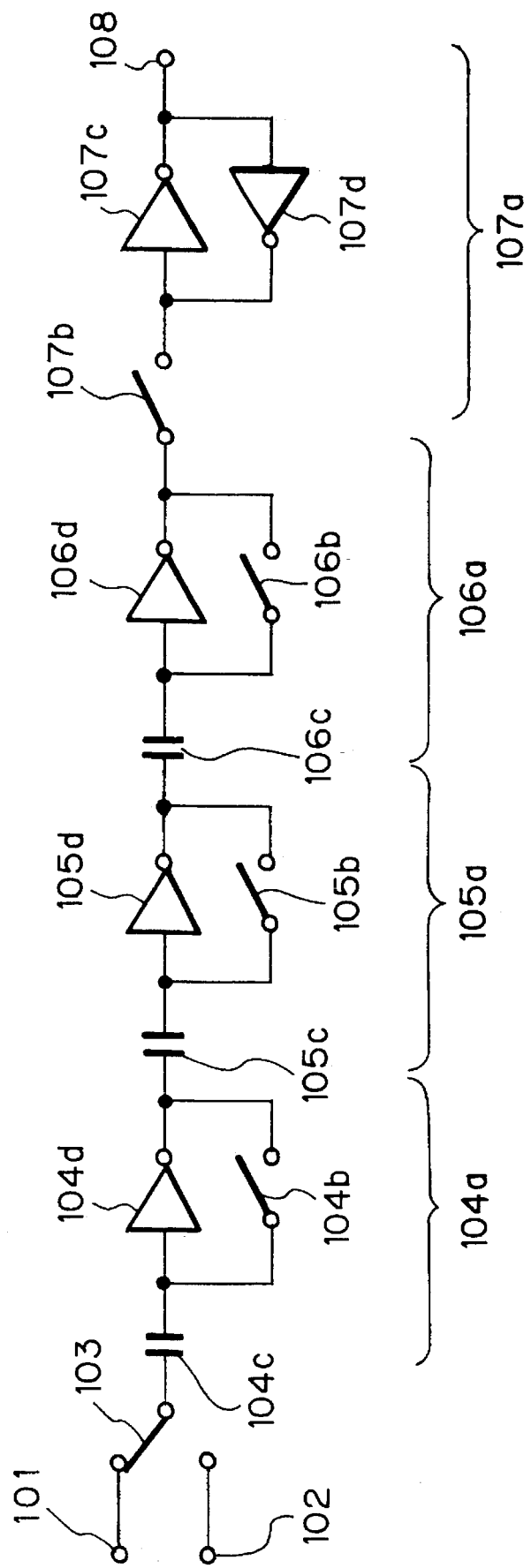
FIG. 8 shows a conventional chopper type comparator.

To better understand the present invention, a brief reference will be made to a conventional chopper type comparator taught in previously mentioned Japanese Patent Laid-Open Publication No. 63-80617. As shown in FIG. 8, the conventional comparator has a first input terminal 101 and a second input terminal 102. A signal potential Vin and a reference potential Vref are applied to the input terminals 101 and 102, respectively. A switch 102 samples the two potentials Vin and Vref alternately. A first AC amplifying stage 104a, a second AC amplifying stage 105a, a third AC amplifying stage 106a, and a latch circuit 107a are serially connected to the switch 103. The first amplifying stage 104a has a first capacitor 104a, a first inverter 104d, and a first switch 104b for selectively connecting the input and output of the inverter 104d. Likewise, the second amplifying stage 105a has a second capacitor 105c, a second inverter 105d, and a second switch 105b for selectively connecting the input and output of the inverter 105b. Further, the third amplifying stage 106a has a third capacitor 106c, a third inverter 106d, and a third switch 106d for selectively connecting the input and output of the inverter 106d. The latch circuit 107a has a fourth switch 107b, and a fourth inverter and a fifth inverter 107d which are connected in a ring configuration. The reference numeral 108 designates an output terminal.

Figure 9:
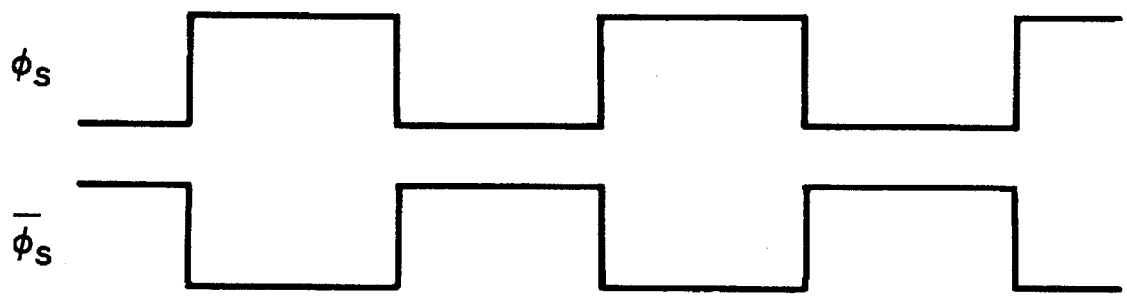
FIG. 9 shows the waveforms of clock signals applicable to a switch included in the conventional comparator.

The switch 103 is alternately connected to the input terminals 101 and 102 by, for example, clock signals ϕ and $\overline{\phi s}$ shown in FIG. 9. The clock signals ϕ and $\overline{\phi s}$ are opposite in phase to each other. The switches 104b, 105b and 106b are also controlled by the clock signal $\overline{\phi s}$ while the switch 107b is controlled by the clock signal ϕ. When the clock signal $\overline{\phi s}$ goes high, the switch 103 is connected to the input terminal 102, and the switches 104b, 105b and 106b are turned on. As a result, the reference potential Vref is applied to the circuitry and dissipates charges remaining in the capacitors 105c and 106c. When the clock signal $\phi s$ goes high, the switch 103 is connected to the input terminal 101, and the switches 104b, 105b and 106b are turned off. Consequently, the signal potential Vin is applied to the circuitry.

When the above procedure is repeated at the period shown in FIG. 9, a fluctuating potential which is Vin over one half of one period and Vref over the other half is applied to the input terminal the capacitor 104c. As a result, the capacitor 104c cuts off DC components. The resulting voltage difference |Vin−Vref| is applied to the input terminal of the inverter 104d. The voltage |Vin−Vref| is inverted and amplified by the inverter 104d and then fed to the second AC amplifying stage 105a. In this way, the difference between the signal potential Vin and the reference potential Vref is sequentially amplified by the consecutive amplifying stages 104, 105a and 106a to a logical level.

In the latch circuit 107a, when the clock signal $\phi s$ goes high, the switch 107b is turned on. In this condition, the signal sequentially amplified by the amplifying stages 104a, 105a and 106a is inverted by the inverter 107c and then applied to the output terminal 108. When the clock signal $\phi s$ goes low, the switch 107b is turned off. As a result, the output of the latch circuit 107a remains at the current value without regard to the output of the amplifying stages due to the inverters 107c and 107d.

The chopper type comparator described above has a simple construction and consumes a minimum of power because there is no current that constantly flows therethrough. However, this kind of comparator is susceptible to noise due to its single end configuration. Specifically, assume that noise higher in level than the input signal is introduced into the signal or the signal path due to the charge injection of switches and extraneous noise. Then, signal components are cancelled because the comparator lacks means for separating a signal and noise, so that the comparator is caused to malfunction. Particularly, in a dual analog/digital LSI having both an analog circuit and a digital circuit, it is difficult to attain a high resolution because the digital circuit generates great noise. One of most effective measures for reducing the power consumption of an LSI is to lower the power source voltage. However, this is not practicable with the above comparator because lowering the power source voltage would lower the dynamic range of the signal and, therefore, the S/N (Signal-to-Noise) ratio based on the constant noise level.

Figure 10:
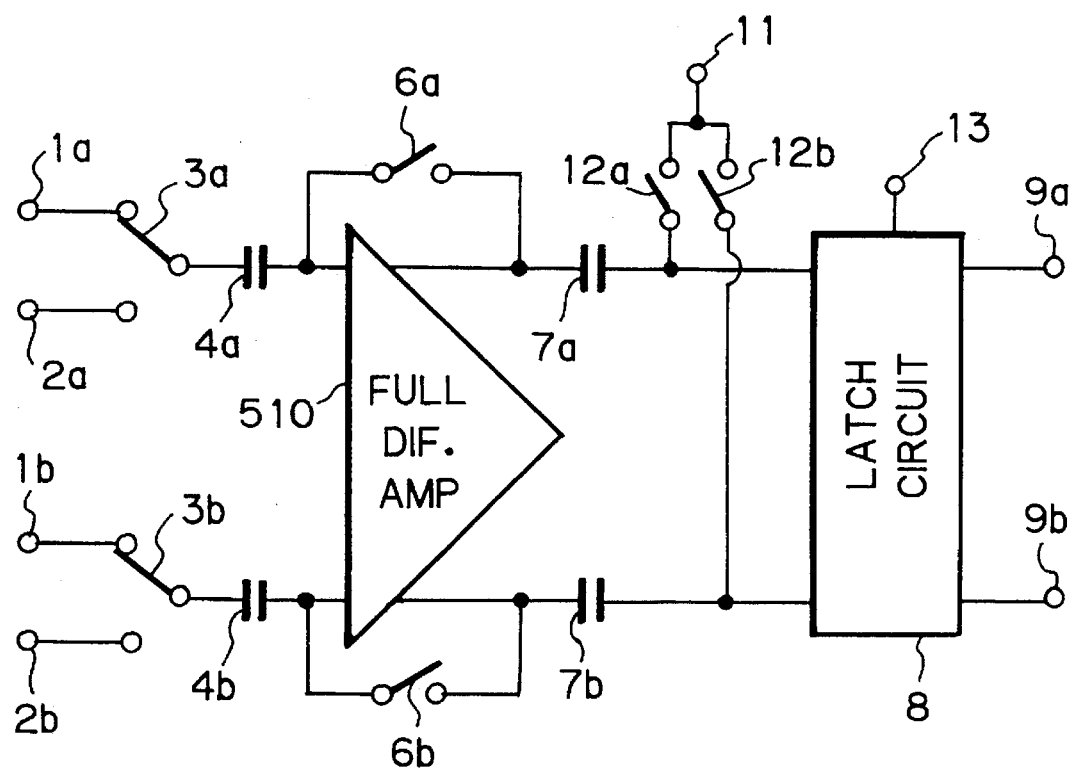
FIG. 10 shows a conventional differential chopper type amplifier.
Figure 11A:
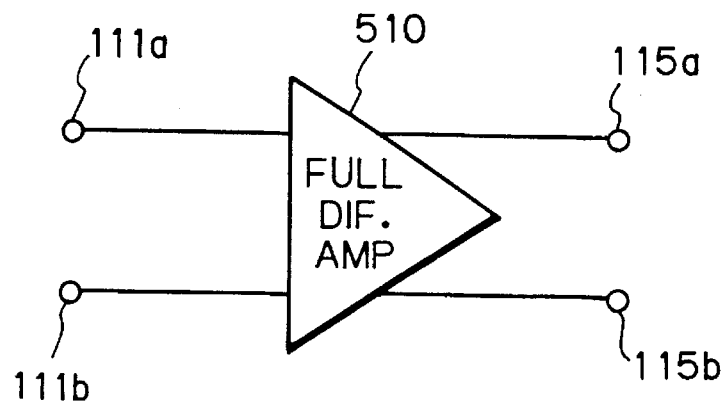
FIG. 11A shows a conventional full differential amplifier.
Figure 11B:
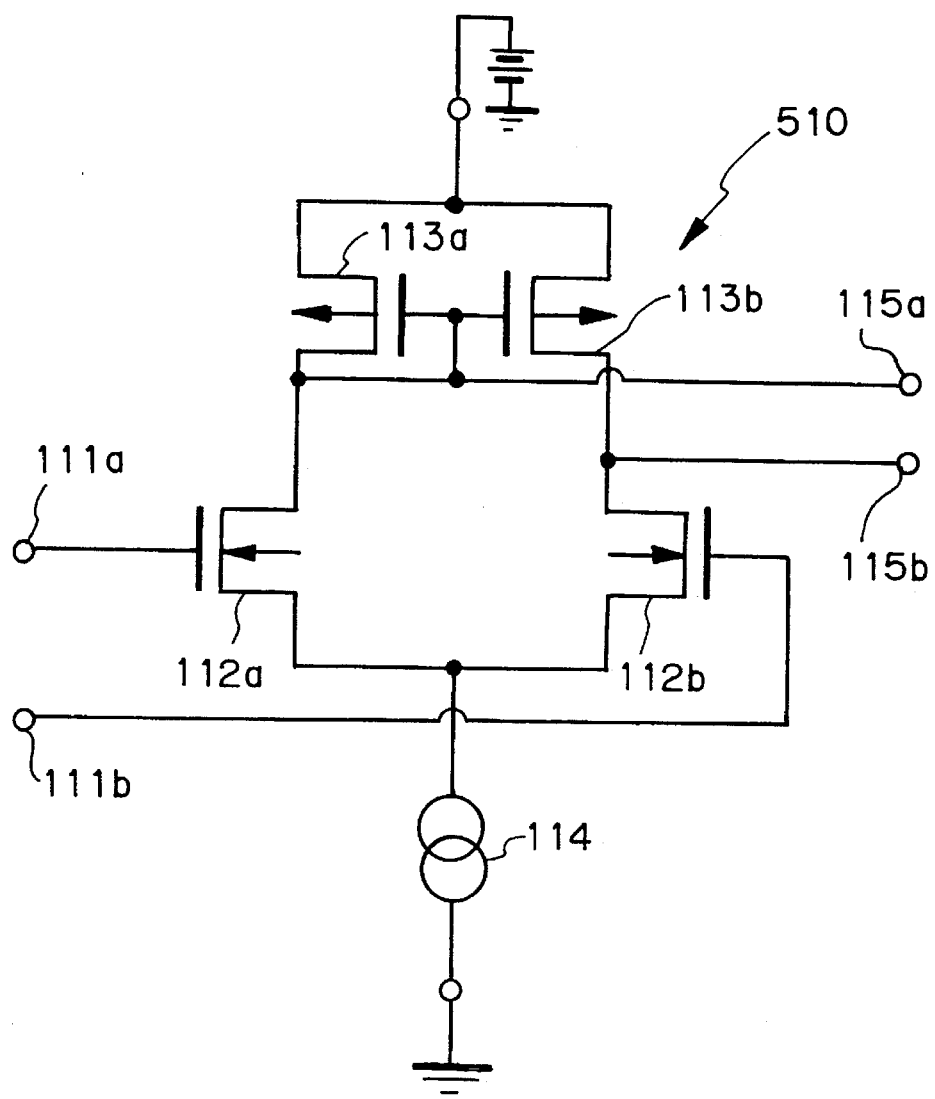
FIG. 11B shows the full differential amplifier in detail.

FIG. 10 shows another conventional chopper type comparator which is proposed in "IEEE Journal of Solid-State Circuits", Vol. SC-20, No. 3, June 1985, pp. 775–779 also mentioned earlier. As shown, the comparator, or differential chopper type comparator, has a first input terminal 1a to which a positive signal potential Vinp is applied, and a second input terminal 2a to which a positive reference potential Vrefp is applied. A first switch 3a is selectively connected to one of the input terminals 1a and 2a. Further, the comparator has a third input terminal 1b to which a negative signal potential Vinm is applied, and a fourth input terminal 2b to which a negative reference potential Vrefm is applied. A switch 3b is selectively connected to one of the input terminals 1b and 2b. A first capacitor 4a and a second capacitor 4b are respectively connected at one end thereof to the stationary terminals of the switches 3a and 3b. A full differential amplifier 510 is connected to the other ends of the capacitors 4a and 4b. A third capacitor 7a and a fourth capacitor 7b are each connected to the output terminal of the full differential amplifier 510. A latch circuit 8 is connected to the output terminals of the capacitors 7a and 7b. In FIG. 10, there are also shown switches 6a, 6b, 12a and 12b, a bias terminal 11, output terminals 9a and 9b, and a clock signal terminal 13. FIGS. 11A and 11B show the full differential amplifier 510 in detail.

With the above differential comparator, it is possible to cancel noise of the same phase. However, because current constantly flow through the full differential amplifier 510, the comparator consumes much power. Moreover, should the power source voltage be lowered in order to lower power consumption, the gain of the amplifier 510 and, therefore, resolution would be deteriorated.

Preferred embodiments of the comparator in accordance with the present invention will be described which are free from the problems discussed above.

Figure 1:
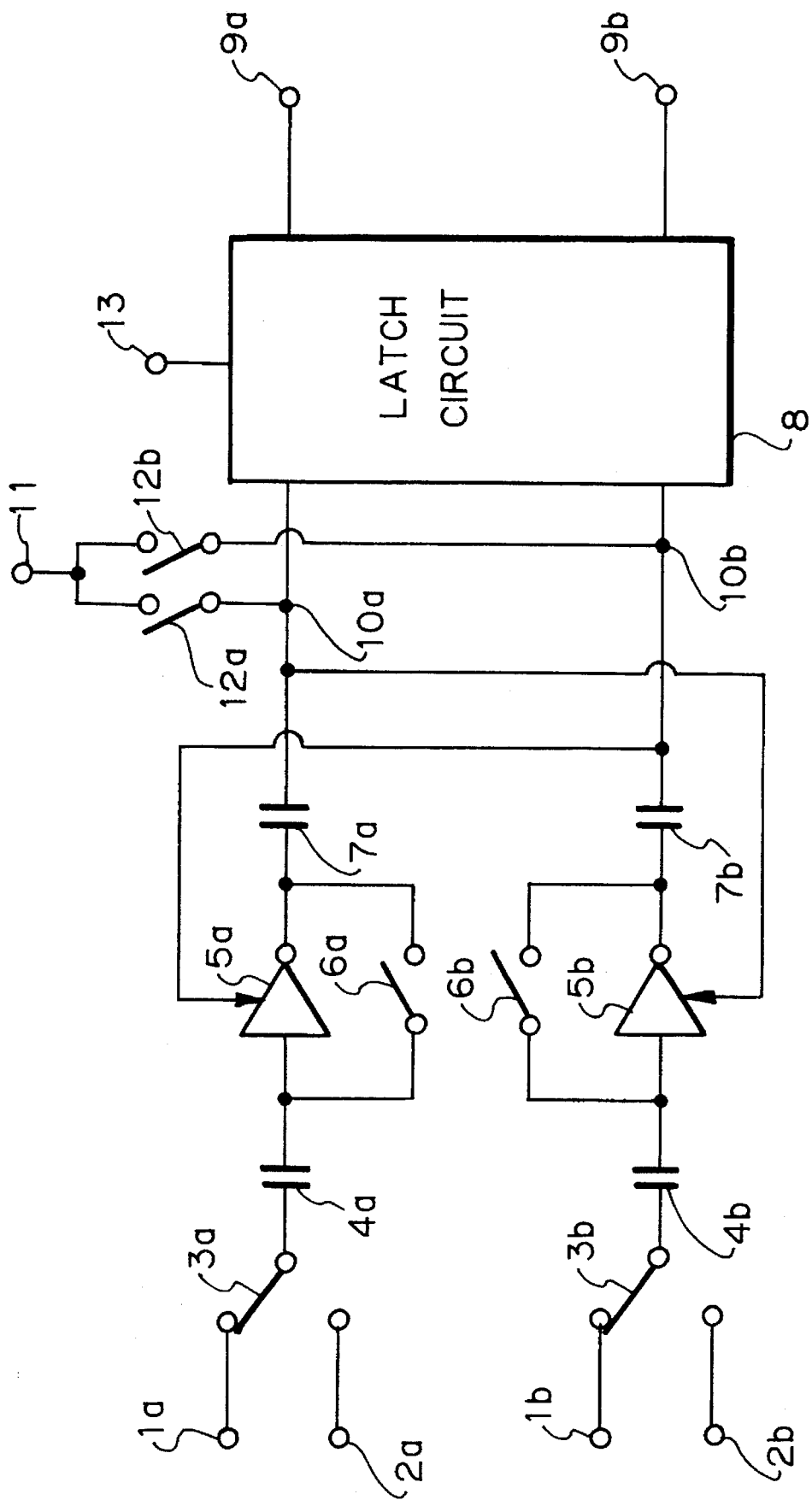
FIG. 1 is a block diagram schematically showing a first embodiment of the comparator in accordance with the present invention.

Referring to FIG. 1, a first embodiment of the present invention is shown. In FIG. 1, the same or similar constituent parts as or to the parts shown in FIG. 10 are designated by the same reference numerals. As shown, the comparator has a first input terminal 1a assigned to a positive signal potential Vinp, a second input terminal 2a assigned to a positive reference potential Vrefp, a third input terminal 1b assigned to a negative signal potential Vinm, and a fourth input terminal 2b assigned to a negative reference potential Vrefm. A switch 3a is selectively connected to one of the first and second input terminals 1a and 2a, while a switch 3b is selectively connected to one of the second and third input terminals 1b and 2b. A first capacitor 4a and a second capacitor 4b are respectively connected at one end thereof to the stationary terminals of the switches 3a and 3b. A first inverter amplifier 5a and a second inverter amplifier 5b, each having a control terminal, are respectively connected to the other ends of the capacitors 4a and 4b. The input and output of the inverter amplifier 5a are connected to each other by a first switch 6a. Likewise, the input and output of the inverter amplifier 5b are connected by a second switch 6b.

A third capacitor 7a and a fourth capacitor 7b are respectively connected to the outputs of the inverter amplifiers 5a and 5b. The capacitors 7a and 7b are respectively connected to a first node 10a and a second node 10b. The nodes 10a and 10b are connected to the inputs of a latch circuit 8. At the same time, the nodes 10a and 10b are respectively connected to the control terminals of the inverter amplifiers 5b and 5a. A bias terminal 11 is connected to the nodes 10a and 10b by a third switch 12a and a fourth switch 12b, respectively.

When the clock signal $\phi s$ goes high, the switches 3a and 3b are connected to the input terminals 1a and 1b, respectively. When the clock signal $\phi s$ goes low, the switches 3a and 3b are connected to the input terminals 2a and 2b, respectively. The switches 6a, 6b 12a and 12b are ON/OFF controlled by a clock signal $\overline{\phi s}$ opposite in phase to the signal $\phi s$.

In operation, when the switches 3a and 3b are respectively connected to the input terminals 2a and 2b due to the low level of the clock signal $\phi s$, the positive reference potential Vrefp and the negative reference potential Vrefm are applied to the capacitors 4a and 4b, respectively. At this instant, the switches 6a, 6b, 12a and 12b are turned on. As a result, the nodes 10a and 10b are biased to a potential Vb on the bias terminal 11 and, in turn, bias the inputs and outputs of the inverter amplifiers 5a and 5b to the same potential. When the clock signal $\phi s$ goes high, the switches 6a, 6b, 12a and 12b are turned off. In this condition, the positive signal potential Vinp and negative signal potential Vinm are applied to the circuitry.

Assume that the above procedure is repeated at t h e period shown in FIG. 9. Then, when Vrefp is higher than Vinp, a voltage difference (Vrefp–Vinp) is applied to the input of the inverter amplifier 5a. When Vrefm is higher than Vinm, a voltage difference (Vrefm–Vinm) is applied to the input of the inverter amplifier 5b. The inverter amplifiers 5a and 5b each inverts and amplifies the input voltage difference and feeds the resulting voltage to the junction 10 or 10b via the capacitor 7a or 7b. The latch circuit 8 compares the potentials on the nodes 10a and 10b and produces logical outputs Q and $\overline{Q}$ on output terminals 9a and 9b, respectively.

The logical output Q of the comparator is expressed as:

$$Q = \begin{cases} H & \dots & (Vrefp - Vinp) > (Vrefm - Vinm) \\ L & \dots & (Vrefp - Vinp) < (Vref - Vinm) \end{cases} \quad \text{Eq. (1)}$$

$$Q = \begin{cases} H & \dots & (Vrefp - Vrefm) > (Vinp - Vinm) \\ L & \dots & (Vrefp - Vrefm) < (Vinp - Vinm) \end{cases} \quad \text{Eq. (2)}$$

As the Eq. (2) indicates, a difference between the input signal potentials and a difference between the reference potentials are compared.

Assume that the signals on the nodes 10a and 10b vary differentially, e.g., the potential on the node 10a rises while the potential on the node 10b falls. Then, the signal on the node 10a is fed back to the control terminal of the inverter amplifier 5b and causes the output potential of the amplifier 5b to fall. Likewise, the signal on the node 10b is fed back to the control terminal of the inverter amplifier 5a and causes the output potential of the amplifier 5a to rise.

Assume that the signals on the nodes 10a and 10b vary in the same phase, i.e., both the potentials on the nodes 10a and 10b rise. Then, the signal on the node 10a and fed back to the control terminal of the inverter amplifier 5b causes the output potential of the amplifier 5b to fall. Likewise, the signal on the node 10b causes the output potential of the inverter amplifier 5a to fall. In this manner, the feedback of the outputs of opposite phases allows the inverter amplifiers 5a and 5b to operate such that the nodes 10a and 10b vary in the same phase. This successfully removes noise of the same phase and compares only the differential signal components.

Another advantage achievable with the embodiment is that the switches 12a and 12b and capacitors 7a and 7b allow the bias level Vb of the control terminals of the inverter amplifiers 5a and 5b and the input terminals of the latch circuit 8 to be freely set up at the outside of the circuitry.

Figure 2A:
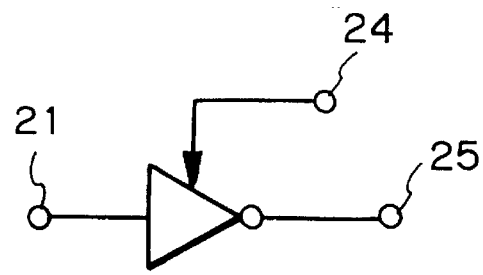
FIG. 2A shows a specific configuration of an inverter amplifier having a control terminal and included in the first embodiment.
Figure 2B:
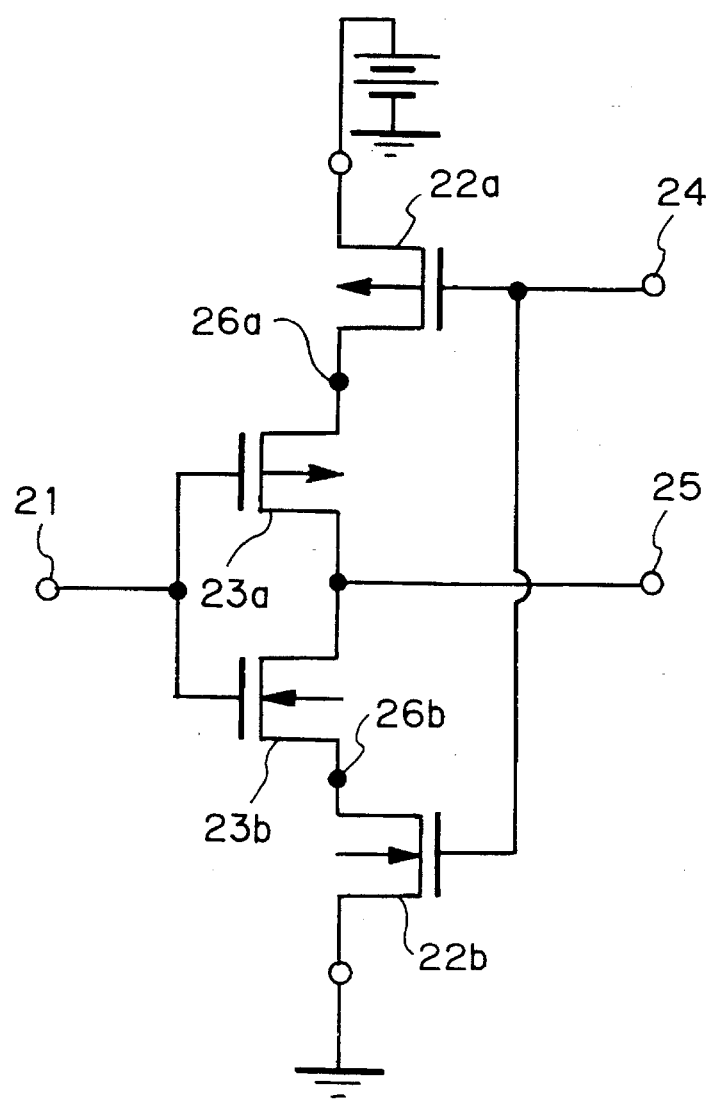
FIG. 2B shows the inverter amplifier of FIG. 2A in detail.
Figure 3:
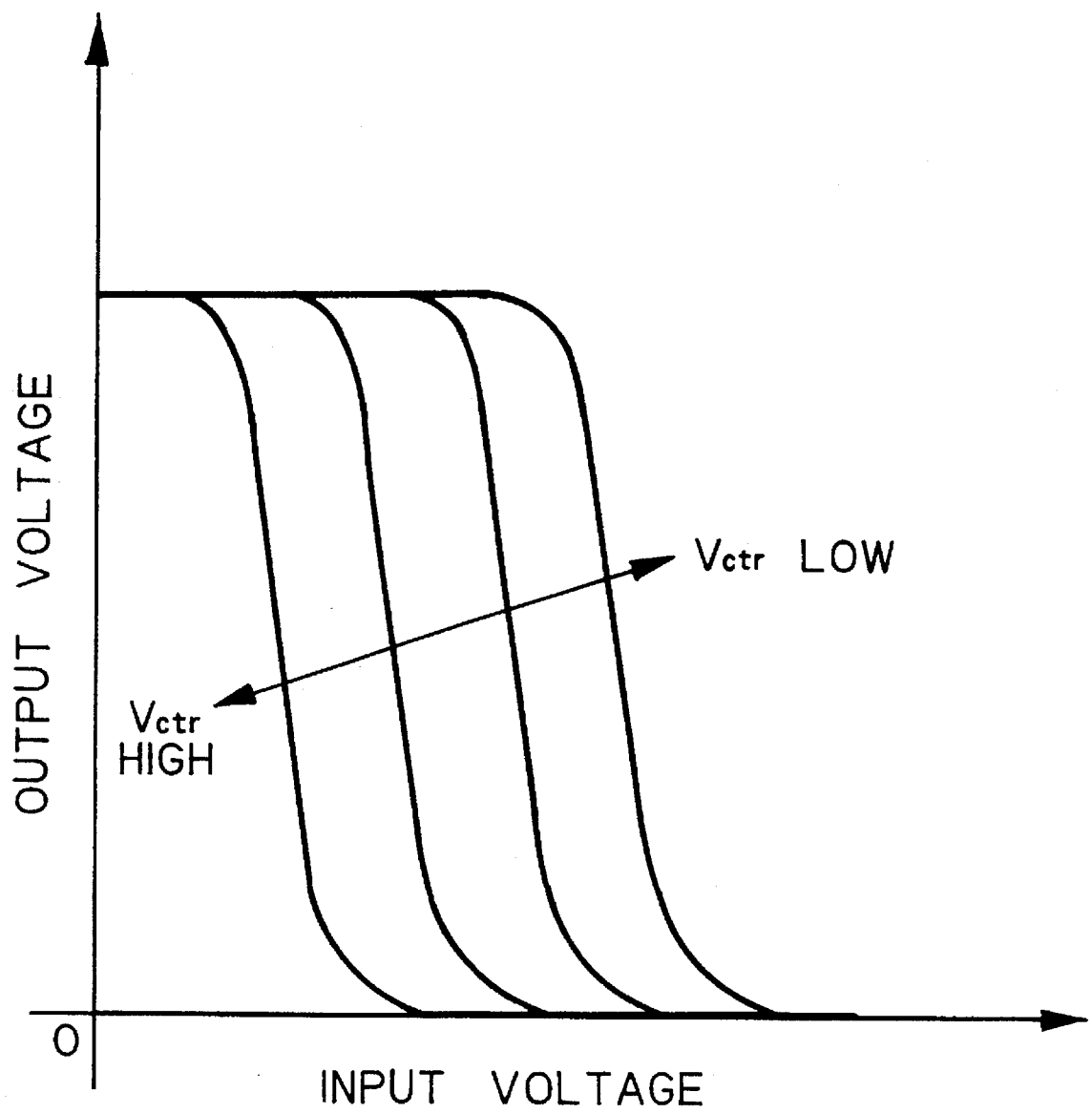
FIG. 3 is a graph indicative of a relation between the input voltage and the output voltage of the inverter amplifier shown in FIGS. 2A and 2B.

FIGS. 2A and 2B show a specific configuration of one of the inverter amplifiers 5a and 5b. FIG. 3 is a graph indicative of a relation between the input voltage and the output voltage of the circuitry shown in FIGS. 2A and 2B.

As shown in FIGS. 2A and 2B, a first p type MOSFET 22a, a second p type MOSFET 23a, a second n type MOSFET 23b and a first n type MOSFET 22b have their sources and drains serially connected in the order of p, p, n and n. The gate of the p type MOSFET 22a and the gate of the n type MOSFET 2 2 b are connected to each other to constitute a control terminal 24. The gate of the p type MOSFET 23a and the gate of the n type MOSFET 23b are connected to constitute an input terminal 21. The drain of the p type MOSFET 23a and the drain of the n type MOSFET 23b are connected to constitute an output terminal 25.

In the circuitry shown in FIGS. 2A and 2B, the MOSFETs 22a and 22b play the role of variable resistors, i.e., they vary the potentials on the sources 26a and 26b the MOSFETs 23a and 23b, respectively, on the basis of a potential Vctr appearing on the control terminal 24. The MOSFETs 23a and 23b serve as inverters whose threshold voltage varies as shown in FIG. 3. Specifically, when the potential Vctr on the control terminal 24 rises, the channel resistance of the MOSFET 22a increases while the channel resistance of the MOSFET 22b decreases. As a result, the potentials on the sources 26a and 26b of the MOSFETs 23a and 23b, respectively, both fall, so that a low level is allowed to appear on the output terminal 25 often. Conversely, when the potential Vctr falls, the potentials on the source terminals 26a and 26b of the MOSFETs 23a and 23b rise. This allows a high level to appear on the output terminal 25 often.

Figure 4A:
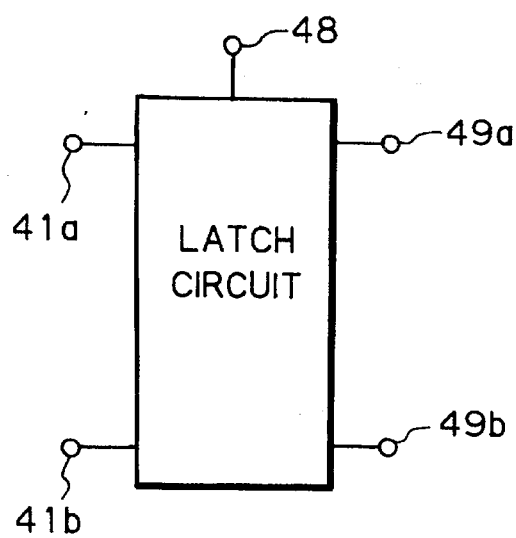
FIG. 4A shows a specific configuration of a latch circuit also included in the first embodiment.
Figure 4B:
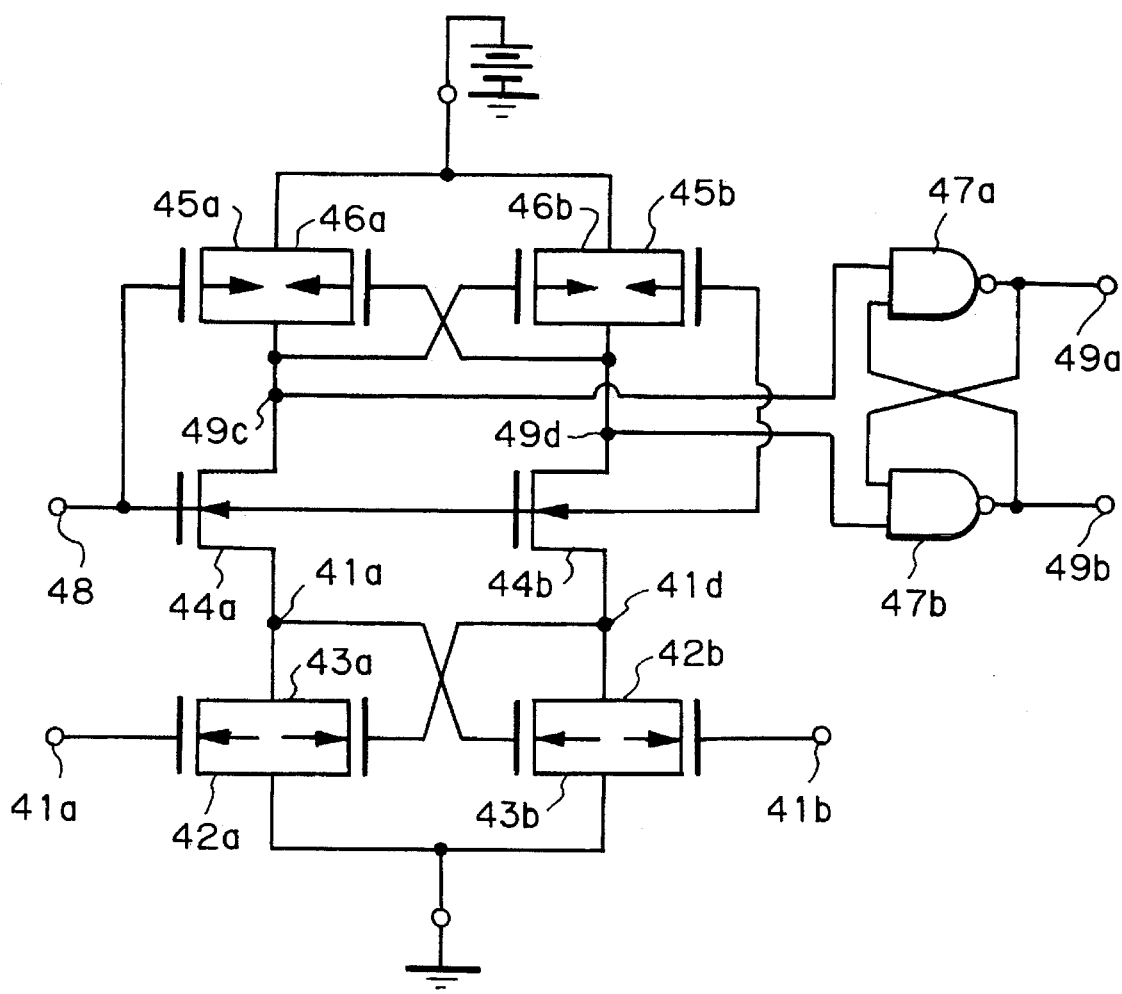
FIG. 4B shows the latch circuit of FIG. 4A in detail.

FIGS. 4A and 4B show a specific configuration of the latch circuit 8, FIG. 1. As shown, the latch circuit is made up of a latch circuit having a first n type MOSFET 42a, a second n type MOSFET 42b, a third n type MOSFET 43a, and a fourth n type MOSFET 43b, a latch circuit having a first p type MOSFET 45a, a second p type MOSFET 45b, a third p type MOSFET 46a, and a fourth p type MOSFET 46b, and an SR latch circuit having a first switching transistor 44a, a second switching transistor 44b, a first NAND gate 47a, and a second NAND gate 47b.

In the circuitry shown in FIGS. 4A and 4B, assume that a potential V1 on a first input terminal 41a is higher than a potential V2 on a second input terminal 41b. Then, the n type MOSFETs 42a and 42b cause a potential on a first node 41c to become lower than a potential on a second node 41d. At this instant, the transistors 43a and 43b serve to increase the potential difference.

On the other hand, when a clock signal terminal 48 is in a low level, the switching transistors 44a and 44b are turned off. Hence, potentials on a third and a fourth node 49c and 49d, respectively, are maintained in a high level by the p type MOSFETs 45a and 45b. As a result, a first and a second output terminal 49a and 49b, respectively, hold their previous outputs. When the potential on the clock signal terminal 48 is in a high level, the switching transistors 44a and 44b are turned on with the result that potentials on the third node 49c and fourth node 49d become equal to the potentials on the first node 41c and second node 41d, respectively. The p type MOSFETs 46a and 46b, like the n type MOSFETs 43a and 43b, serve to increase the potential difference between the nodes 49c and 49d. When the potential V1 on the input terminal 41a is higher than the potential V2 on the input terminal 41b, the potential on the node 49c goes low while the potential on the node 49d goes high. Consequently, the NAND gates 47a and 47b cause the potentials on the output terminals 49a and 49b to go high and to go low, respectively.

Figure 5:
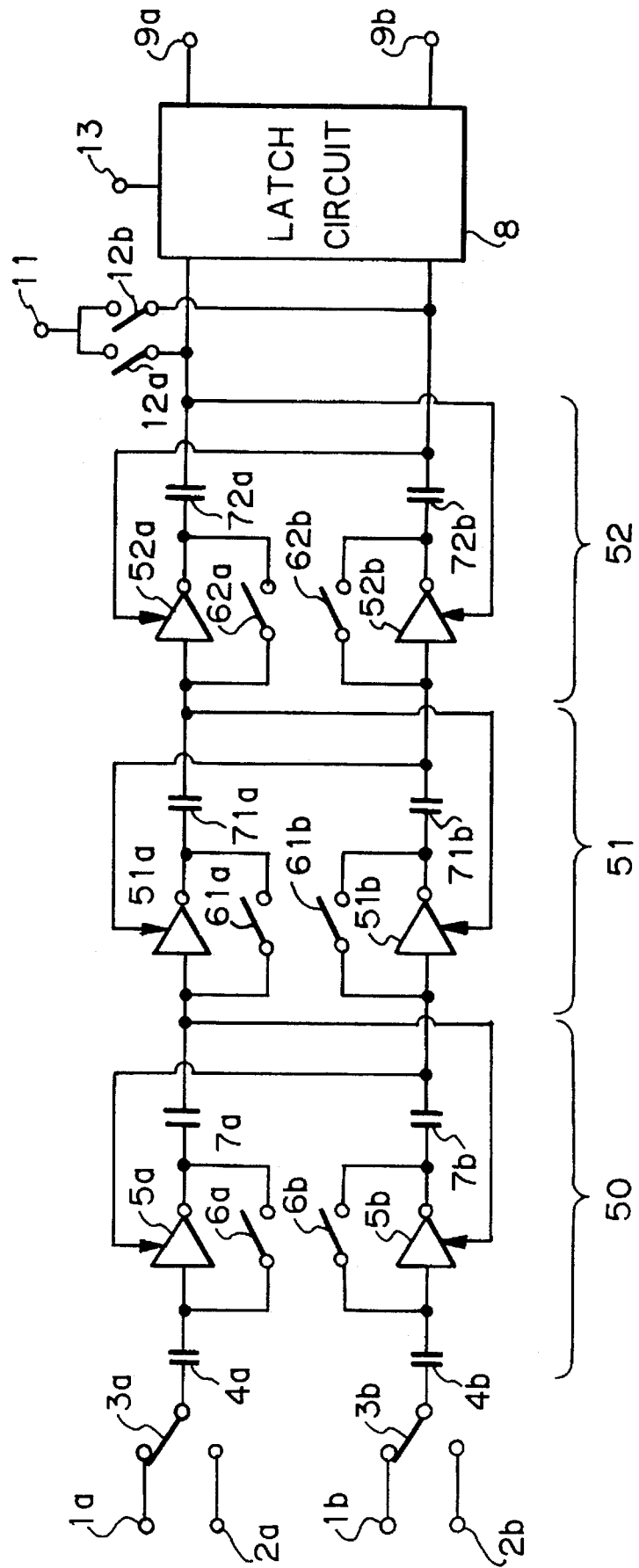
FIGS. 5, 6 and 7 are schematic block diagrams respectively showing a second, a third and a fourth embodiment of the present invention.

Referring to FIG. 5, a second embodiment of the present invention will be described. As shown, this embodiment differs from the first embodiment in that a first differential inverter amplifier 50, a second differential inverter amplifier 51, and a third inverter amplifier 52 are serially connected between the switches 3a and 3b and the latch circuit 8.

In the differential inverter amplifier 50, the inputs of the inverter amplifiers 5a and 5b, each having a control terminal, are connected to the capacitors 4a and 4b, respectively. The input and output of the inverter amplifier 5a are connected to each other by the switch 6a, while the input and output of the inverter amplifier 5b are connected by the switch 6b. The capacitors 7a and 7b are connected to the outputs of the inverter amplifiers 5a and 5b, respectively. The other ends of the capacitors 7a and 7b are respectively connected to the control terminals of the inverter amplifiers 5b and 5a.

The differential inverter amplifier 51 has a first inverter amplifier 51a and a second inverter amplifier 51b each having a control terminal. The input and output of the inverter amplifier 51 are connected to each other by a first switch 61a. Likewise, the input and output of the inverter amplifier 51b are connected by a second switch 61b. A third and a fourth capacitor 71a and 71b, respectively, are connected to the outputs of the inverter amplifiers 51a and 51b, respectively. The other ends of the capacitors 71a and 71b are connected to the control terminals of the inverter amplifiers 51b and 51a, respectively.

The serial connection of the differential inverter amplifiers 50, 51 and 52 increases the amplification ratio of the amplifying stage and thereby realizes a comparator having a high resolution. It is to be noted that the three differential inverter amplifiers are only illustrative and may be replaced with any other plural differential inverter amplifiers.

Figure 6:
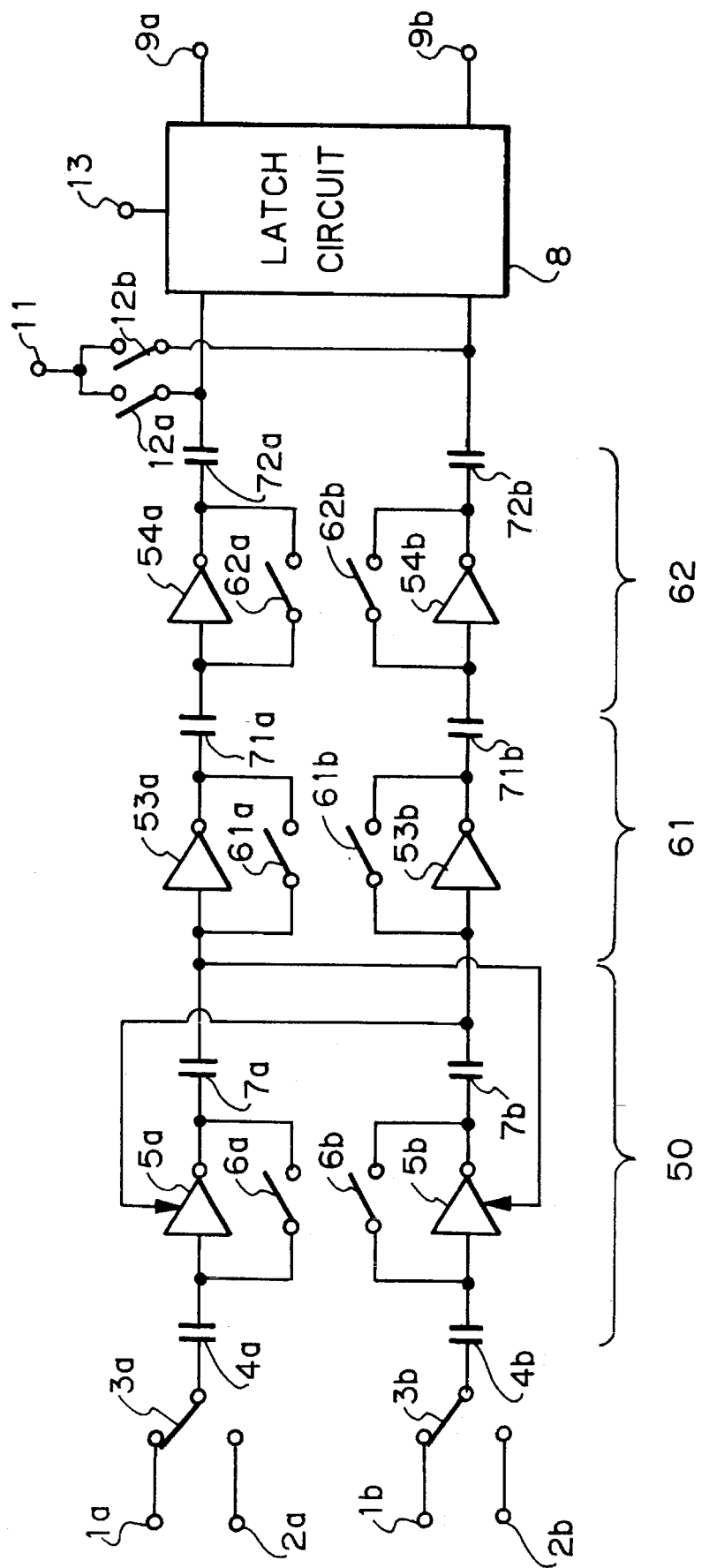

FIG. 6 shows a third embodiment of the present invention having a first inverter amplifier stage 61 and a second inverter amplifier stage 62. The first inverter amplifier stage 61 has a first inverter amplifier 53a and a second inverter amplifier 53b in place of the inverter amplifiers 51a and 51b of the second embodiment, respectively. The second inverter amplifier stage 62 has a first inverter amplifier 54a and a second inverter amplifier 54b in place of the inverter amplifiers 52a and 52b of the second embodiment, respectively. The differential inverter amplifier 50 cancels noise of the same phase while the inverter amplifier stages 61 and 62 enhances the resolution of the comparator. It is to be noted that three or more inverter amplifier stages may be connected, if desired.

Figure 7:
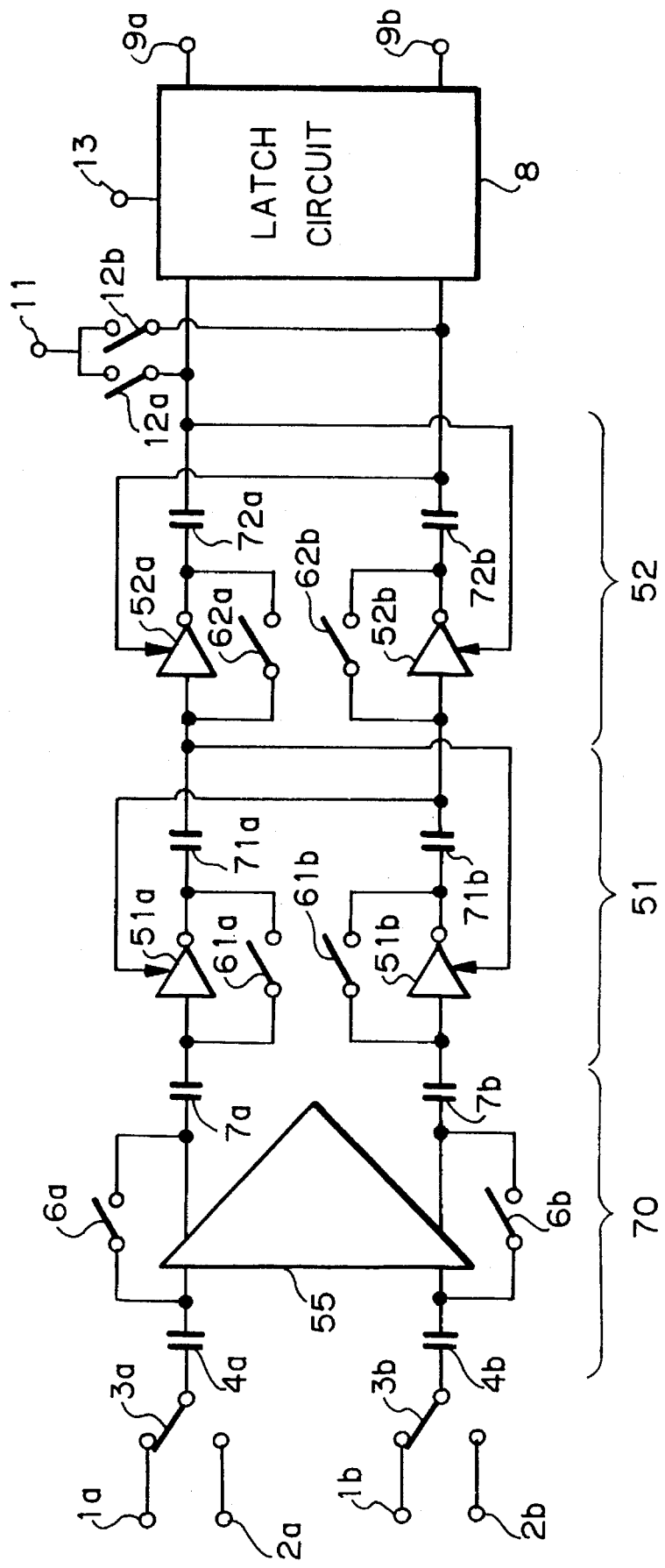

A fourth embodiment of the present invention is shown in FIG. 7 and implemented as a differential chopper type comparator. As shown, the comparator has a full differential amplifier stage 70 in place of the first differential amplifier 50 of the second embodiment. The full differential amplifier stage 70 has a full differential amplifier 55 having one input connected to one end of the capacitor 4a, having one input and one output connected by the switch 6a, having the above output connected to the capacitor 7a, having the other input connected to the capacitor 4b, having this input and the associated output connected by the switch 6b, and having the associated output connected to the capacitor 7b. The full differential amplifier 70 cancels noise of the same phase and thereby reduces the load on the differential inverter amplifiers 51 and 52. The comparator is, therefore, operable at high speed with high accuracy. It is to be noted that three or more differential inverter amplifiers may be connected, if desired.

In summary, it will be seen that the present invention provides a chopper type comparator which implements a differential feature with inverter amplifiers each having a control terminal. The comparator, therefore, successfully cancels noise of the same phase while preventing a current from constantly flowing therethrough. The cancellation of noise of the same phase, coupled with the differential signals, doubles the signal range in the same voltage range, compared to a single end configuration. Hence, a high resolution is achievable even when the power source voltage is low.

Various modifications will become possible for those skilled in the art after receiving the teachings of the present disclosure without departing from the scope thereof.

What is claimed is:

1. A comparator comprising:

a first input terminal to which a positive signal potential is applied;

a second input terminal to which a positive reference potential is applied;

a first selecting switch for selecting one of said first and second input terminals at a time;

a first capacitor connected at one end to a stationary terminal of said first selecting switch;

a first inverter amplifier having a control terminal and connected at an input thereof to the other end of said first capacitor;

a first switch connected to an input and an output of said first inverter amplifier;

a second capacitor connected at one end thereof to said output of said first inverter amplifier;

a third input terminal to which a negative signal voltage is applied;

a fourth input terminal to which a negative reference potential is applied;

a second selecting switch for selecting one of said third and fourth input terminals at a time;

a third capacitor connected at one end thereof to a stationary terminal of said second selecting switch;

a second inverter amplifier having a control terminal and connected at an input thereof to the other end of said third capacitor;

a second switch connected to said input and an output of said second inverter amplifier;

a fourth capacitor connected at one end thereof to said output of said second inverter amplifier;

a latch circuit connected at one input thereof to the other end of said second capacitor and at another input thereof to the other end of said fourth capacitor;

a third switch connected between a bias terminal and said control terminal of said second inverter amplifier;

a fourth switch connected between said bias terminal and said control terminal of said first inverter amplifier;

a first output terminal connected to one output terminal of said latch circuit; and a second output terminal connected to the other output terminal of said latch circuit.

2. A comparator as claimed in claim 1, wherein said first and second inverter amplifiers each comprises:

a first p type MOSFET connected at a source thereof to a positive DC power source;

a second p type MOSFET connected at a source thereof to a drain of said first p type MOSFET;

a second n type MOSFET connected at a drain thereof to a drain of said second p type MOSFET;

a first n type MOSFET connected at a drain thereof to a source of said second n type MOSFET, and connected at a source thereof to ground;

an input terminal connected to a gate of said second p type MOSFET and a gate of said second n type MOSFET;

a control terminal connected to a gate of said first p type MOSFET and a gate of said first n type MOSFET; and an output terminal connected between said drain of said second p type MOSFET and said second n type MOSFET.

3. A comparator as claimed in claim 1, wherein said latch circuit comprises:

a first and a second p type MOSFET each connected to a positive DC power source at a source thereof;

a first n type switching transistor connected at a drain thereof to drains of said first and second p type MOSFETs;

a first and a second n type MOSFET each connected to said first n type switching transistor at a drain thereof, and each connected to ground at a source thereof;

a third and a fourth p type MOSFET each connected to said positive DC power source at a source thereof;

a second N switching transistor connected at a drain thereof to drains of said third and fourth P MOSFETs;

a third and a fourth n type MOSFET each connected to a source of said second n type switching transistor at a drain thereof, and each connected to ground at a source thereof;

a first NAND gate connected at one input thereof to said drain of said first n type switching transistor;

a second NAND gate connected at one input thereof to said drain of said second n type switching transistor;

a clock signal terminal connected to a gate of said first p type MOSFET and a gate of said first n type switching transistor;

a first input terminal connected to said gate of said first n type MOSFET;

a second input terminal connected to a gate of said third n type MOSFET;

a first output terminal connected to an output terminal of said first NAND gate; and a second output terminal connected to an output terminal of said second NAND gate;

wherein said drain of said third p type MOSFET is connected to a gate of said second p type MOSFET, wherein said drain of said first p type MOSFET is connected to a gate of said fourth p type MOSFET, wherein a gate of said second n type switching transistor is connected to said gate of said first n type switching transistor, wherein said source of said second n type switching transistor is connected to a gate of said second n type MOSFET, wherein said source of said first n type switching transistor is connected to said gate of said fourth n type MOSFET; wherein said output terminal of said second NAND gate is connected to the other input terminal of said first NAND gate, and wherein said output terminal of said first NAND gate is connected to the other input terminal of said second NAND gate.

4. A comparator as claimed in claim 1, wherein said first to fourth capacitors, said first and second inverter amplifiers, and said first and second switches constitute a differential inverter amplifier.

5. A comparator as claimed in claim 4, wherein a plurality of said differential inverter amplifiers are serially connected between said first and second selecting switches and said latch circuit.

6. A comparator as claimed in claim 5, further comprising a full differential amplifier stage connected between said first and second selecting switches and said differential inverter amplifiers, said full differential amplifier stage comprising:

a full differential amplifier connected at one input thereof to said one end of said first capacitor and connected at the other input thereof to said one end of said second capacitor;

a fifth switch connected to one input and one output of said full differential amplifier; and a sixth switch connected to the other input and the other output of said full differential amplifier.

7. A comparator as claimed in claim 4, further comprising:

a plurality of inverter amplifier stages serially connected between said differential inverter amplifier and said latch circuit;

said plurality of inverter amplifier stages each comprising:

a third inverter amplifier connected at an input thereof to said other end of said second capacitor;

a fifth switch connected to an input and an output of said third inverter amplifier;

a fourth inverter amplifier connected at an input thereof to said other end of said fourth capacitor; and a sixth switch connected to an input and an output of said fourth inverter amplifier.

* * * * *